United States Patent
Chang et al.

(10) Patent No.: US 8,993,365 B2
(45) Date of Patent: Mar. 31, 2015

(54) WAFER PACKAGING METHOD

(71) Applicant: Xintec Inc., Zhongli, Taoyuan County (TW)

(72) Inventors: Yi-Ming Chang, Pingzhen (TW); Kuo-Hua Liu, Pingzhen (TW); Yi-Cheng Wang, Pingzhen (TW); Sheng-Yen Chang, Zhongli (TW)

(73) Assignee: Xintec Inc., Taoyuan (TW)

( * ) Notice: Subject to any disclaimer, the term of this patent is extended or adjusted under 35 U.S.C. 154(b) by 0 days.

(21) Appl. No.: 14/191,348

(22) Filed: Feb. 26, 2014

(65) Prior Publication Data

US 2014/0242742 A1 Aug. 28, 2014

Related U.S. Application Data

(60) Provisional application No. 61/770,025, filed on Feb. 27, 2013.

(51) Int. Cl.
*H01L 21/00* (2006.01)
*H01L 31/0203* (2014.01)
*H01L 21/683* (2006.01)

(52) U.S. Cl.
CPC ........ *H01L 31/0203* (2013.01); *H01L 21/6836* (2013.01)

USPC .......................................................... 438/64

(58) Field of Classification Search
CPC ............ H01L 21/6835; H01L 21/6836; H01L 31/0203
USPC ..................... 438/106–127, 612–617, 64–69; 257/667, 670, 673
See application file for complete search history.

(56) References Cited

U.S. PATENT DOCUMENTS

2006/0051935 A1 * 3/2006 Silverbrook .................. 438/458

* cited by examiner

*Primary Examiner* — Brook Kebede
(74) *Attorney, Agent, or Firm* — Liu & Liu

(57) ABSTRACT

A wafer packaging method includes the following steps. A wafer having a plurality of integrated circuit units is provided. A first surface of the wafer opposite to the integrated circuit units is ground. A release layer is formed on a second surface of a light transmissive carrier. An ultraviolet temporary bonding layer is formed on the second surface of the light transmissive carrier or a third surface of the wafer. The ultraviolet temporary bonding layer is used to adhere the second surface of the light transmissive carrier to the third surface of the wafer. The first surface of the wafer is adhered to an ultraviolet tape. A fourth surface of the light transmissive carrier is exposed to ultraviolet to eliminate adhesion force of the ultraviolet temporary bonding layer. The light transmissive carrier and the release layer are removed.

17 Claims, 18 Drawing Sheets

WAFER PACKAGING METHOD

RELATED APPLICATIONS

This application claims priority to U.S. provisional Application Ser. No. 61/770,025, filed Feb. 27, 2013, which is herein incorporated by reference.

BACKGROUND

1. Field of Invention

The present invention relates to a wafer packaging method.

2. Description of Related Art

In manufacture of an image sensor chip, e.g., a CMOS chip, on a wafer, an optical glass sheet is often used to cover the surface of the wafer for protection, to avoid dust attaching on the image sensing region of the wafer. However, as a chip diced from the wafer and used in an electrical product, the chip is aligned with a light-transmissive sheet, which is usually disposed on the housing of the electrical product and has the protection ability of the light-transmissive sheet similar with that of the optical glass sheet on the surface of the chip.

In case the surface of the wafer is not covered by the optical glass sheet, the light transmittance of the wafer may be improved, so as the image sensing ability of the diced chip. However, in that the thickness of the wafer is significantly thin (e.g., around 150 µm), the wafer having ball grid array (BGA) is very difficult for the movement. For example, after the grinding of the wafer having the optical glass sheet, the BGA can be formed on a surface of the wafer opposite to the optical glass sheet. Thereafter, the wafer having the optical glass sheet is placed on the tape of an iron frame and then diced. The optical glass sheet can provide a supporting force to the wafer, to prevent the wafer from cracking by warpage. If the surface of the wafer has no the optical glass sheet, the wafer, frame in the placement of the wafer on the iron frame, is easily cracked due to warpage, or hardly to precisely place on the tape of the iron.

In addition, when the surface of the wafer has the optical glass sheet, an upper surface of a conductive pad located on the edge of the wafer is required to be electrically connected to a conductive wire. In this regard, the region above the conductive pad cannot be covered by the optical glass sheet. As a result, after the process of bonding, such as Dam On Glass (DOG), of the optical glass sheet to the wafer the conductive pad of the wafer is contaminated during a subsequent dicing process or a chemical liquid process, so as to reduce the yield rate of the wafer.

SUMMARY

An aspect of the present invention is to provide a wafer packaging method.

According to one embodiment of the present invention, a wafer packaging method includes the following steps. (a) A wafer having a plurality of integrated circuit units is provided. (b) A first surface of the wafer opposite to the integrated circuit units is ground. (c) A light transmissive carrier is provided. (d) A release layer is formed on a second surface of the light transmissive carrier. (e) An ultraviolet temporary bonding layer is formed on the second surface of the light transmissive carrier or a third surface of the wafer opposite to the first surface. (f) The ultraviolet temporary bonding layer is used to adhere the second surface of the light transmissive carrier to the third surface of the wafer, such that the release layer is covered by the ultraviolet temporary bonding layer. (g) The first surface of the wafer is adhered to an ultraviolet tape. (h) A fourth surface of the light transmissive carrier opposite to the second surface is exposed to ultraviolet to eliminate adhesion force of the ultraviolet temporary bonding layer. Further, (i) the light transmissive carrier and the release layer located on third surface of the wafer are removed.

In one embodiment of the present invention, the wafer packaging method further includes: a portion of the ultraviolet temporary bonding layer located on an edge of the release layer is removed.

In one embodiment of the present invention, the ultraviolet tape is located in an opening of a frame.

In one embodiment of the present invention, the wafer packaging method further includes: the ultraviolet temporary bonding layer located on the third surface of the wafer is cleaned.

In one embodiment of the present invention, the wafer packaging method further includes: a notch is formed on the ultraviolet tape adjacent to an edge of the wafer. A supporting tape is adhered to the third surface of the wafer and the frame. A portion of the ultraviolet tape between the notch and the frame is removed.

In one embodiment of the present invention, the wafer packaging method further includes: the ultraviolet tape is exposed to ultraviolet to eliminate adhesion force of the ultraviolet tape. The ultraviolet tape located on the first surface of the wafer is removed.

In one embodiment of the present invention, the wafer packaging method further includes: the wafer is diced after the ultraviolet tape is removed from the wafer.

In one embodiment of the present invention, the thickness of the light transmissive carrier is in a range from 300 to 500 µm.

In one embodiment of the present invention, the thickness of the light transmissive carrier is greater than the thickness of the wafer.

In one embodiment of the present invention, the strength of the light transmissive carrier is greater than the strength of the wafer.

In the aforementioned embodiments of the present invention, the wafer does not need to have an optical glass sheet, but the light transmissive carrier can provide a supporting force to the wafer. When the wafer is adhered to the ultraviolet tape of the frame, the wafer does not suffer crack caused by warpage, and can be precisely adhered to the ultraviolet tape of the frame. After the wafer is bonded to the ultraviolet tape of the frame, the light transmissive carrier is adhered to the wafer by the ultraviolet temporary bonding layer, and the adhesion force of the ultraviolet temporary bonding layer may be eliminated by exposing the ultraviolet temporary bonding layer to ultraviolet. Therefore, the light transmissive carrier can be removed from the wafer. Moreover, after the wafer having no optical glass sheet is diced, the image sensing chips formed by the wafer may be used in electronic products. Since the surface of the image sensing chip does not have the optical glass sheet, the transmittance of the image sensing chip is improved. Further, the image sensing ability of the image sensing chip is also improved.

Another aspect of the present invention is to provide a wafer packaging method.

According to one embodiment of the present invention, a wafer packaging method includes the following steps. (a) A wafer that has a plurality of integrated circuit units and a plurality of conductive pads is provided. (b) A light transmissive protection sheet is provided. (c) A first dam layer and a second dam layer are formed on a first surface of the light transmissive protection sheet. (d) A permanent bonding layer and a temporary bonding layer are respectively formed on a second surface of the first dam layer opposite to the light transmissive protection sheet and a third surface of the second dam layer opposite to the light transmissive protection sheet. (e) The permanent bonding layer and the temporary bonding layer are adhered on the wafer, such that the temporary bonding layer covers one of the conductive pads of the wafer. Each of the integrated circuit units is surrounded by the first dam layer, and the first dam layer is surrounded by the second dam layer. (f) The light transmissive protection sheet between the first and second dam layers is diced. (g) The second dam layer covering one of the conductive pads and a portion of the light transmissive protection sheet connected to the second dam layer are removed.

In one embodiment of the present invention, the step (g) includes: the temporary bonding layer is exposed to ultraviolet to eliminate adhesion force of the temporary bonding layer.

In one embodiment of the present invention, the step (f) includes: the temporary bonding layer is immersed in a liquid, such that adhesion force of the temporary bonding layer is eliminated.

In one embodiment of the present invention, the wafer packaging method further includes: a conductive wire is electrically connected to one of the conductive pads of the wafer.

In one embodiment of the present invention, the wafer packaging method further includes: a through hole is formed between one of the conductive pads and a fourth surface of the wafer opposite to the light transmissive protection sheet. A conductive wire is electrically connected to one of the conductive pads and a ball grid array located on the fourth surface of the wafer, and the conductive wire is through into the through hole.

In one embodiment of the present invention, the wafer packaging method further includes: an edge of the wafer is etched, such that one of the conductive pads of the wafer is exposed and an inclined plane is formed on the edge of the wafer. A conductive wire is electrically connected to one of the conductive pads and a ball grid array of the wafer, and the conductive wire is abutted against the inclined plane.

In one embodiment of the present invention, each of the integrated circuit units is an image sensor.

In the aforementioned embodiments of the present invention, the light transmissive protection sheet is adhered to the wafer by the permanent bonding layer located on the first dam layer and the temporary bonding layer located on the second dam layer, and the temporary bonding layer covers the conductive pad of the wafer. As a result, during a process after the light transmissive protection sheet is adhered to the wafer, such as during a dicing process or a process passing through chemical liquids, the light transmissive protection sheet and the second dam layer can prevent the conductive pad from pollution or corrosion, such that the yield rate of the wafer can be improved. Moreover, the light transmissive protection sheet between the first and second dam layers can be diced to separate. When the adhesion force of the temporary bonding layer is eliminated (e.g., exposing the temporary bonding layer to ultraviolet or immersing the temporary bonding layer in a liquid), the second dam layer covering the conductive pad and a portion of the light transmissive protection sheet connected to the second dam layer can be removed, such that the conductive pad is exposed, thereby improving the convenience of wire bonding process.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiments, with reference made to the accompanying drawings as follows.

DETAILED DESCRIPTION

Figure 1:
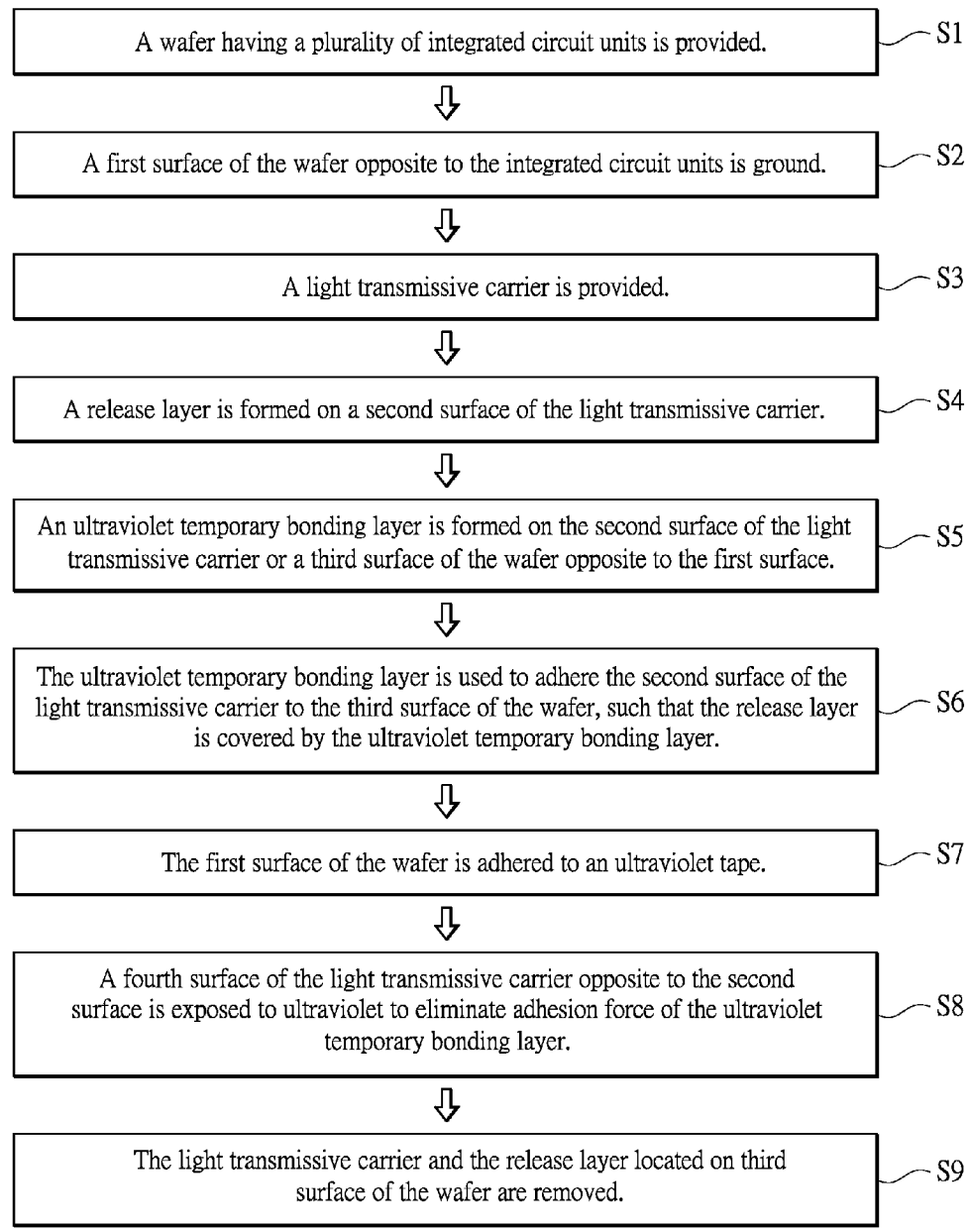
FIG. 1 is a flow chart of a wafer packaging method according to one embodiment of the present invention.

Reference will now be made in detail to the present embodiments of the invention, examples of which are illustrated in the accompanying drawings. Wherever possible, the same reference numbers are used in the drawings and the description to refer to the same or like parts.

FIG. 1 is a flow chart of a wafer packaging method according to one embodiment of the present invention. In step S1, a wafer having a plurality of integrated circuit units is provided.

Thereafter in step S2, a first surface of the wafer opposite to the integrated circuit units is ground ("ground" is referred to as the verb tense of "grind"). Next in step S3, a light transmissive carrier is provided. Thereafter in step S4, a release layer is formed on a second surface of the light transmissive carrier. Next in step S5, an ultraviolet temporary bonding layer is formed on the second surface of the light transmissive carrier or a third surface of the wafer opposite to the first surface. Thereafter in step S6, the ultraviolet temporary bonding layer is used to adhere the second surface of the light transmissive carrier to the third surface of the wafer, such that the release layer is covered by the ultraviolet temporary bonding layer. Next in step S7, the first surface of the wafer is adhered to an ultraviolet tape. Thereafter in step S8, a fourth surface of the light transmissive carrier opposite to the second surface is exposed to ultraviolet to eliminate adhesion force of the ultraviolet temporary bonding layer. Finally in step S9, the light transmissive carrier and the release layer located on third surface of the wafer are removed. In the following descriptions, the aforesaid steps will be described in detail.

Figure 2:
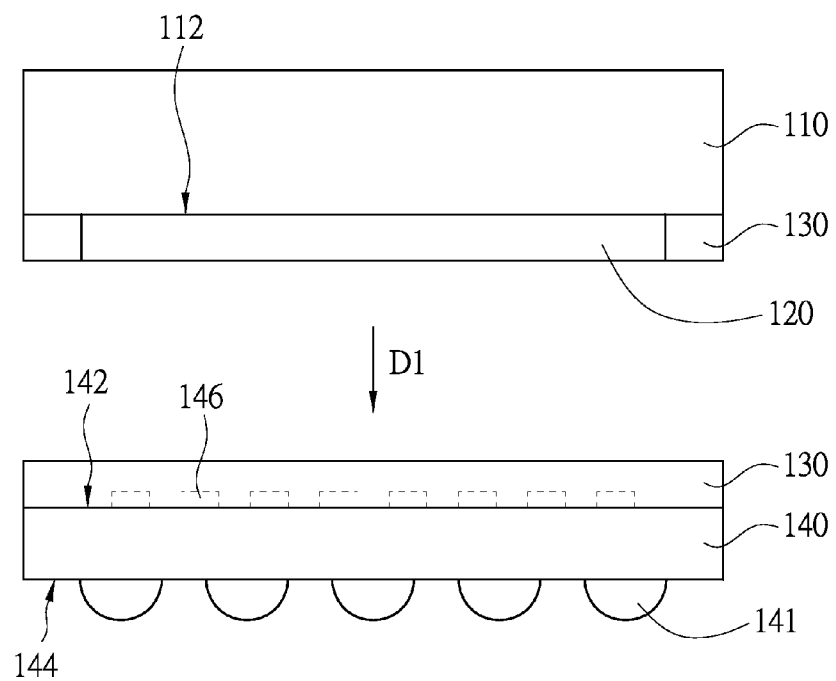
FIG. 2 is a schematic view of a light transmissive carrier shown in FIG. 1 when being adhered to a wafer.
Figure 3A:
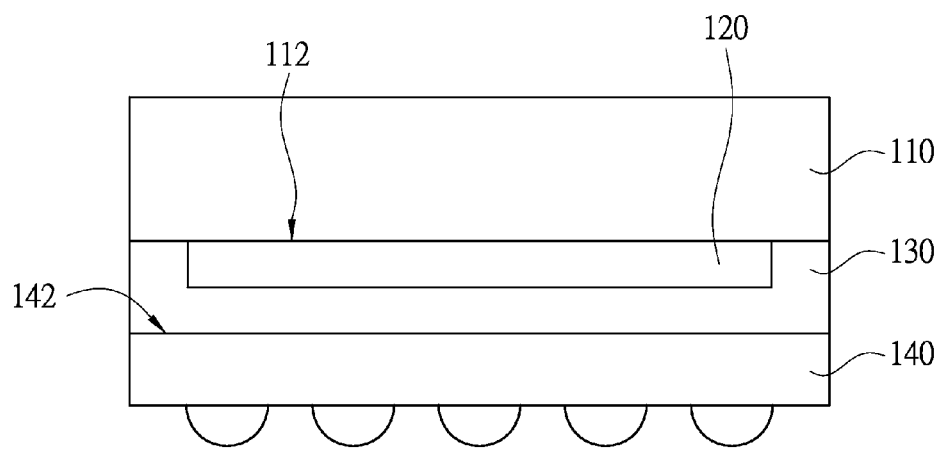
FIG. 3A is a schematic view of the light transmissive carrier shown in FIG. 2 after being adhered to the wafer.

FIG. 2 is a schematic view of a light transmissive carrier 110 shown in FIG. 1 when being adhered to a wafer 140. FIG. 3A is a schematic view of the light transmissive carrier 110 shown in FIG. 2 after being adhered to the wafer 140. As shown in FIG. 2 and FIG. 3A, the wafer 140 has a plurality of integrated circuit units 146 and a ball grind array 141, and the first surface 144 of the wafer 140 opposite to the integrated circuit units 146 have been ground. That is to say, the wafer 140 is formed after a ball grind array (BGA) process. A release layer 120 and an ultraviolet temporary bonding layer 130 are formed on the second surface 112 of the light transmissive carrier 110, and the ultraviolet temporary bonding layer 130 is also formed on the third surface 142 of the wafer 140 opposite to the first surface 144. When the light transmissive carrier 110 is moved to the wafer 140 in a direction D1, the ultraviolet temporary bonding layer 130 is adhered to the second surface 112 of the light transmissive carrier 110 and the third surface 142 of the wafer 140, and the release layer 120 is covered by the ultraviolet temporary bonding layer 130.

In this embodiment, the ultraviolet temporary bonding layer 130 is coated on the light transmissive carrier 110 and the wafer 140, but in another embodiment, the ultraviolet temporary bonding layer 130 may be coated on the light transmissive carrier 110 or the wafer 140, and the present invention is not limited in this regard. Moreover, the light transmissive carrier body 110 may be a glass board, and the thickness of the light transmissive carrier body 110 may be in a range from 300 to 500 μm. The thickness of the light transmissive carrier 110 is greater than the thickness of the wafer 140, or the strength of the light transmissive carrier 110 is greater than the strength of the wafer 140. The wafer 140 may be made of a material that includes silicon, and the thickness of the wafer 140 may be in a range from 100 to 200 μm. When the ultraviolet temporary bonding layer 130 is exposed to ultraviolet, the adhesion force of the ultraviolet temporary bonding layer 130 would be eliminated.

As shown in FIG. 2, the integrated circuit units 146 are shielded by the ultraviolet temporary bonding layer 130. In order to simplify other drawings, the integrated circuit units 146 is not shown in FIGS. 3A to 12.

Figure 3B:
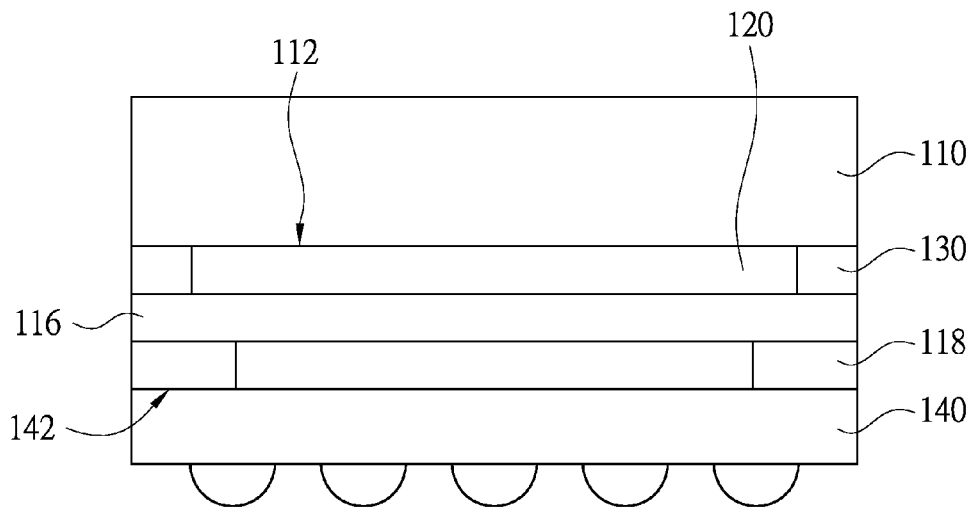
FIG. 3B is a schematic view in another embodiment different from FIG. 3A.

FIG. 3B is a schematic view in another embodiment different from FIG. 3A. As shown in FIG. 2 and FIG. 3B, the third surface 142 of the wafer 140 shown in FIG. 2 may not be coated by the ultraviolet temporary bonding layer 130, and an optical glass sheet 116 may be adhered to the release layer 120 and the ultraviolet temporary bonding layer 130. Thereafter, a dam element 118 may be arranged on the surface of the optical glass sheet 116 facing away from the ultraviolet temporary bonding layer 130. When the light transmissive carrier 110 is moved to the third surface 142 of the wafer 140, the optical glass sheet 116 with the dam element 118 is fixed on the third surface 142 of the wafer 140 so as to form the structure shown in FIG. 3B.

In the following description, since the following processes of FIGS. 3A and 3B are the same, FIG. 3A is selectively used as an example to describe.

Figure 4:
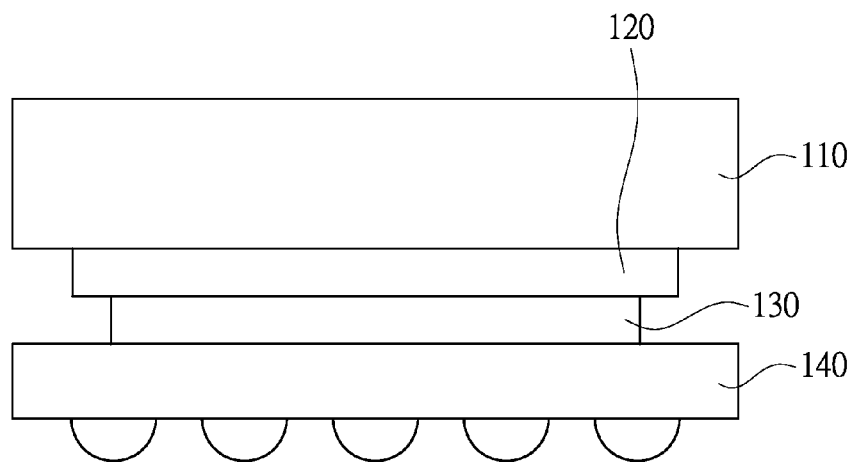
FIG. 4 is a schematic view of a portion of an ultraviolet temporary bonding layer shown in FIG. 3A after being removed.
Figure 5:
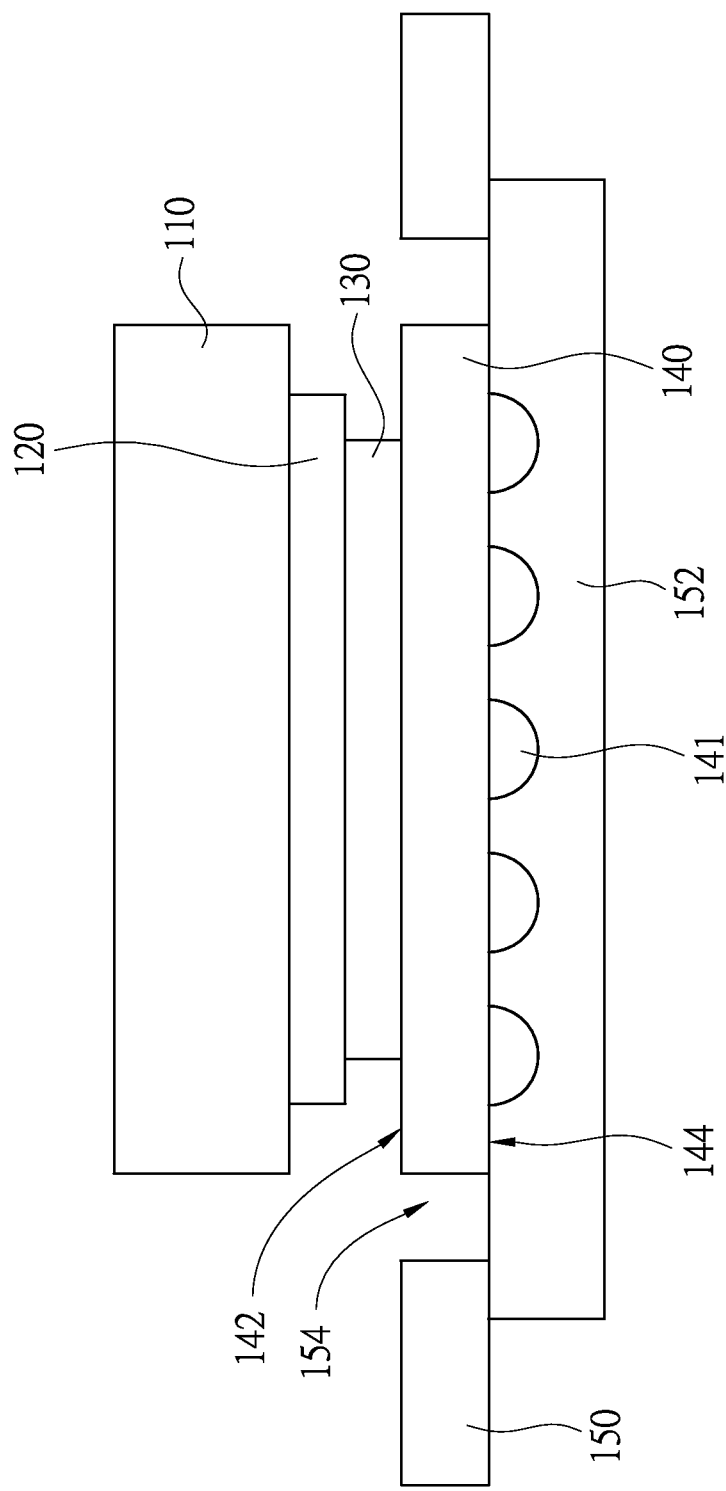
FIG. 5 is a schematic view of the wafer shown in FIG. 4 after being adhered to an ultraviolet tape.

FIG. 4 is a schematic view of a portion of the ultraviolet temporary bonding layer 130 shown in FIG. 3A after being removed. FIG. 5 is a schematic view of the wafer 140 shown in FIG. 4 after being adhered to an ultraviolet tape 152. As shown in FIG. 4 and FIG. 5, for the convenience of removing the light transmissive carrier 110 in the following processes, a portion of the ultraviolet temporary bonding layer 130 located on the edge of the release layer 120 may be removed by chemical way or physical way, such that the edge of the release layer 120 can be exposed. Next, the first surface 114 of the wafer 140 can be adhered to the ultraviolet tape 152, such that the ball grind array 141 of the wafer 140 can be protected by the ultraviolet tape 152. In this embodiment, the ultraviolet tape 152 is located in an opening 154 of a frame 150, but the present invention is not limited in this regard. When the ultraviolet tape 152 is exposed to ultraviolet, the adhesion force of the ultraviolet tape 152 would be eliminated.

Figure 6:
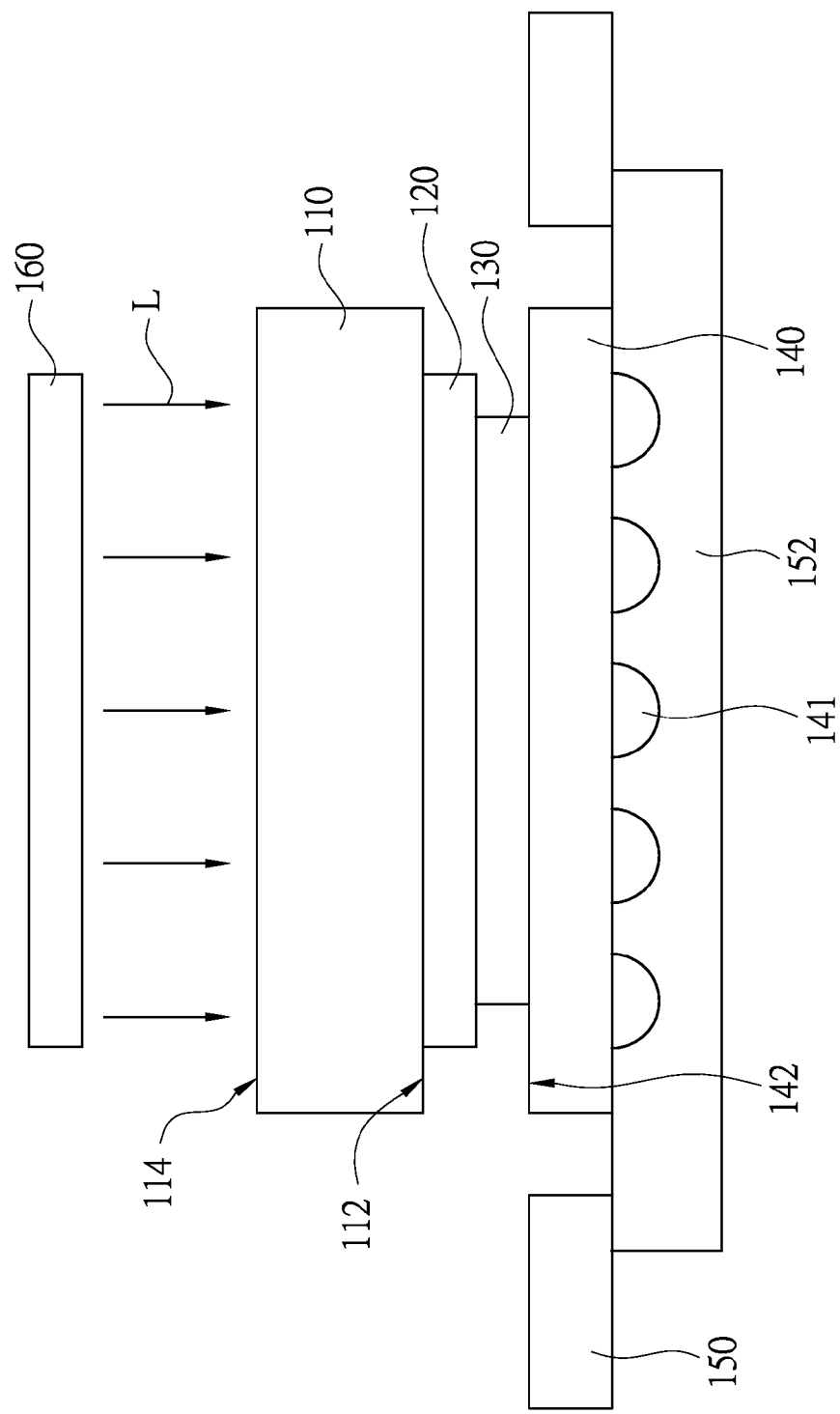
FIG. 6 is a schematic view of the light transmissive carrier shown in FIG. 5 when being exposed to ultraviolet.
Figure 7:
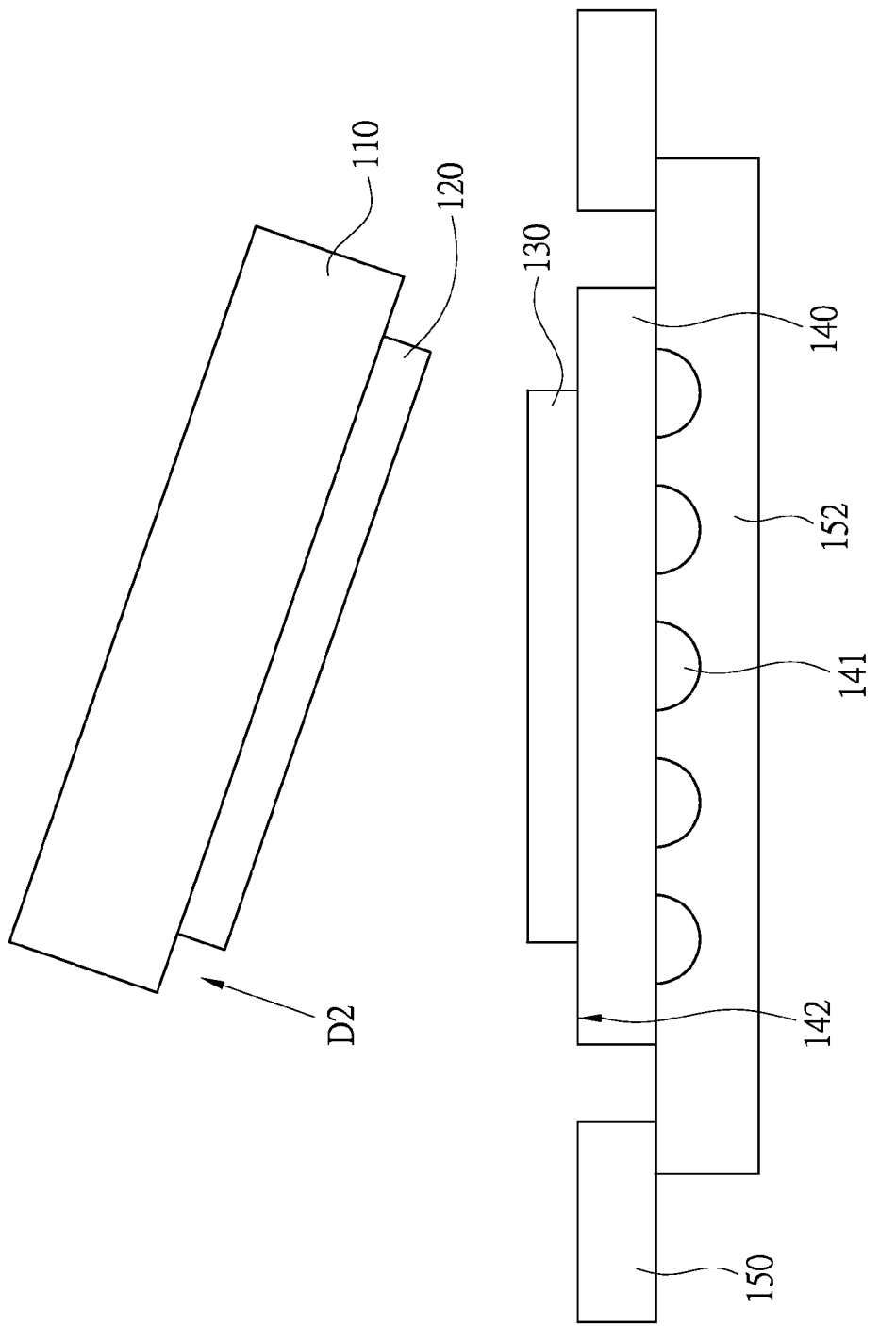
FIG. 7 is a schematic view of the light transmissive carrier shown in FIG. 6 when being removed.

FIG. 6 is a schematic view of the light transmissive carrier 110 shown in FIG. 5 when being exposed to ultraviolet L. FIG. 7 is a schematic view of the light transmissive carrier 110 shown in FIG. 6 when being removed. As shown in FIG. 6 and FIG. 7, an ultraviolet emitting device 160 faces the light transmissive carrier 110, and the fourth surface 114 of the light transmissive carrier 110 opposite to the second surface 112 is exposed to the ultraviolet L. The ultraviolet L may pass through the light transmissive carrier 110 to the ultraviolet temporary bonding layer 130 so as to eliminate the adhesion force of the ultraviolet temporary bonding layer 130. Therefore, the light transmissive carrier 110 and the release layer 120 located on third surface 142 of the wafer 140 can be removed in a direction D2 shown in FIG. 7. After the light transmissive carrier 110 is removed, the ultraviolet temporary bonding layer 140 located on the third surface 142 of the wafer 140 may be cleaned. As a result, through the application of the ultraviolet temporary bonding layer 130 in the present invention, the process of removing (de-bonding) the light transmissive carrier 110 can be performed after the ball grid array process.

Figure 8:
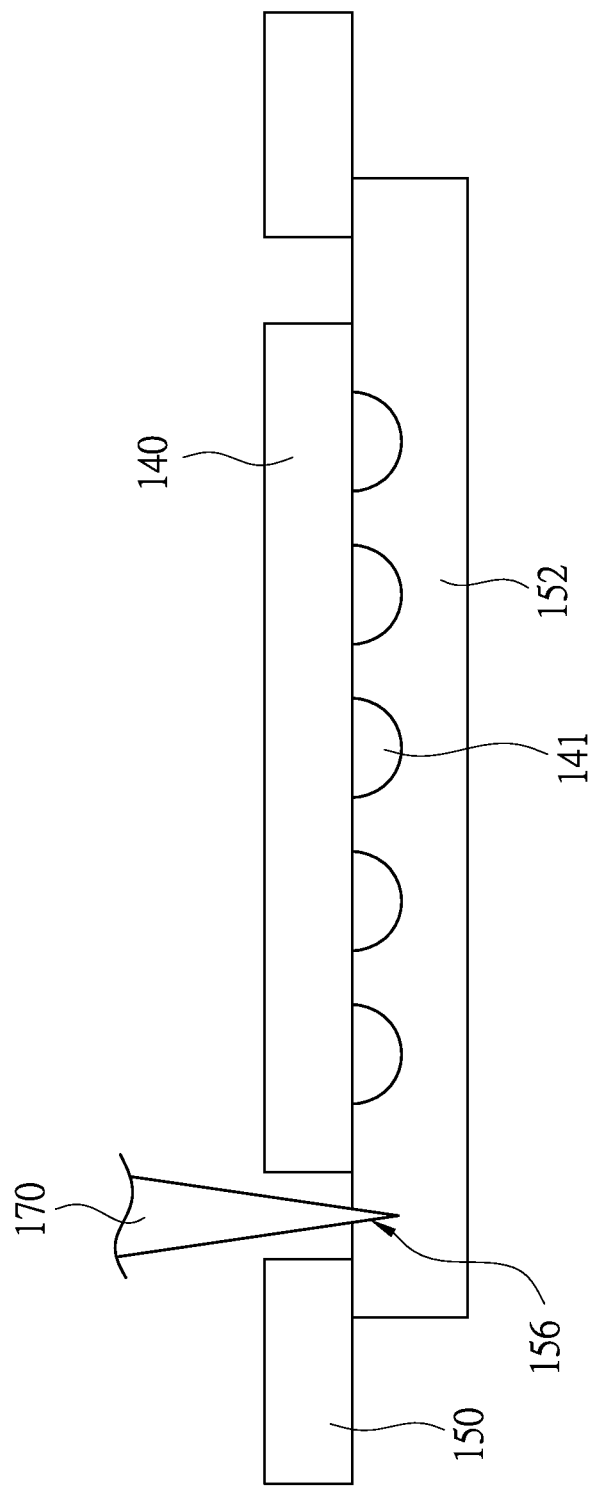
FIG. 8 is a schematic view of the ultraviolet temporary bonding layer and the ultraviolet tape shown in FIG. 7 after the ultraviolet temporary bonding layer is cleaned and when a notch is formed on the ultraviolet tape.
Figure 9:
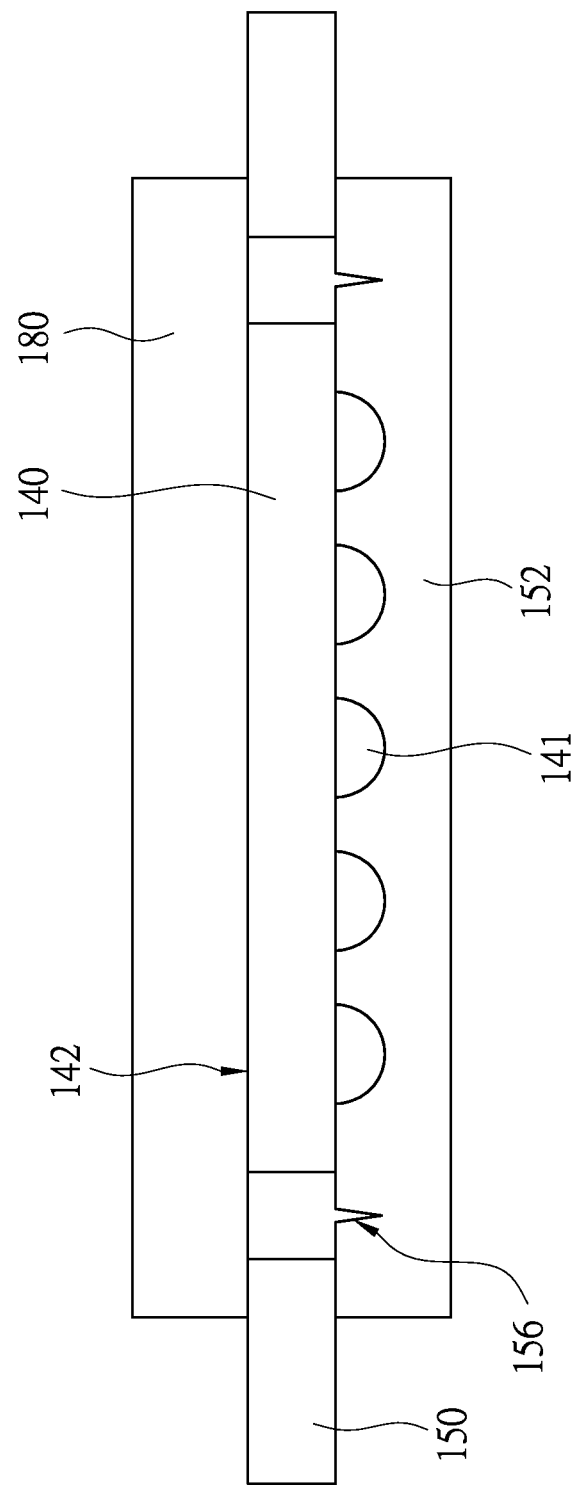
FIG. 9 is a schematic view of the wafer shown in FIG. 8 after being adhered to a supporting tape.

FIG. 8 is a schematic view of the ultraviolet temporary bonding layer 130 and the ultraviolet tape 152 shown in FIG. 7 after the ultraviolet temporary bonding layer 130 is cleaned and when a notch 156 is formed on the ultraviolet tape 152. FIG. 9 is a schematic view of the wafer 140 shown in FIG. 8 after being adhered to a supporting tape 180. As shown in FIG. 8 and FIG. 9, the notch 156 may be formed on the ultraviolet tape 152 adjacent to the edge of the wafer 140 by a cutter 170. Thereafter, the supporting tape 180 may be adhered to the third surface 142 of the wafer 140 and the frame 150.

Figure 10:
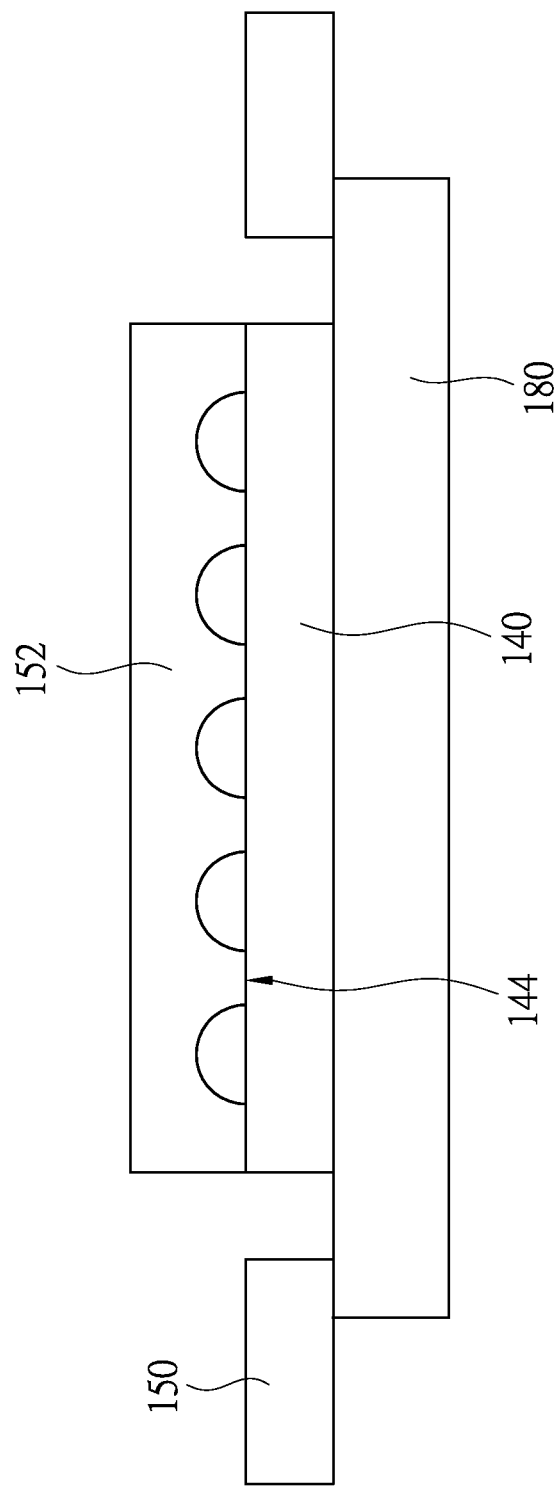
FIG. 10 is a schematic view of a portion of the ultraviolet tape shown in FIG. 9 after being removed and a frame shown in FIG. 9 after being flipped over.

FIG. 10 is a schematic view of a portion of the ultraviolet tape 152 shown in FIG. 9 after being removed and the frame 150 shown in FIG. 9 after being flipped over. As shown in FIG. 9 and FIG. 10, since the supporting tape 180 is adhered to the third surface 142 of the wafer 140, when the frame 150 is flipped 180 degrees, the wafer 140 can be supported by the supporting tape 180. At this moment, the ultraviolet tape 152 has the notch 156. Therefore, a portion of the ultraviolet tape 152 between the notch 156 and the frame 150 can be easily removed (as shown in FIG. 10).

Figure 11:
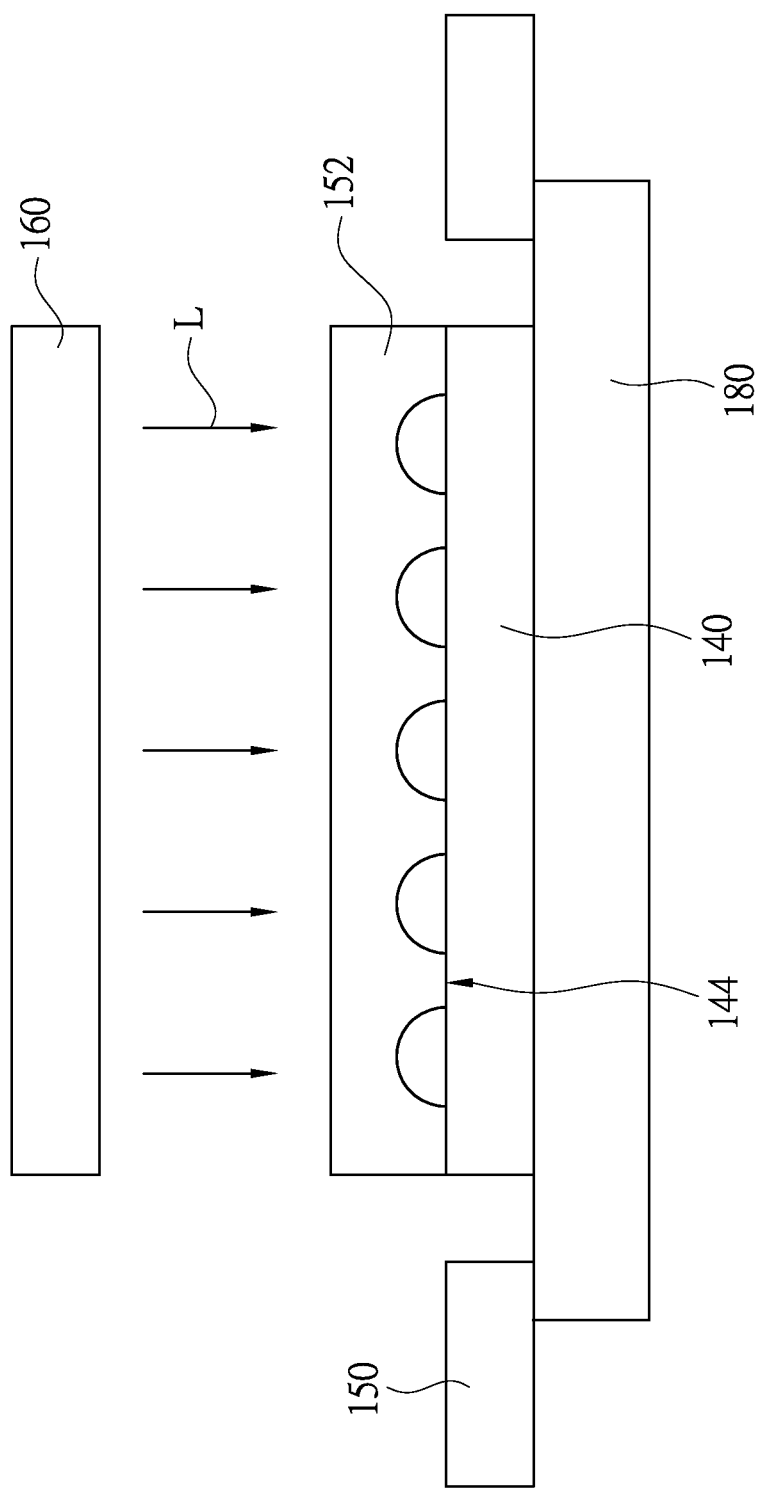
FIG. 11 is a schematic view of the ultraviolet tape shown in FIG. 10 when being exposed to ultraviolet.
Figure 12:
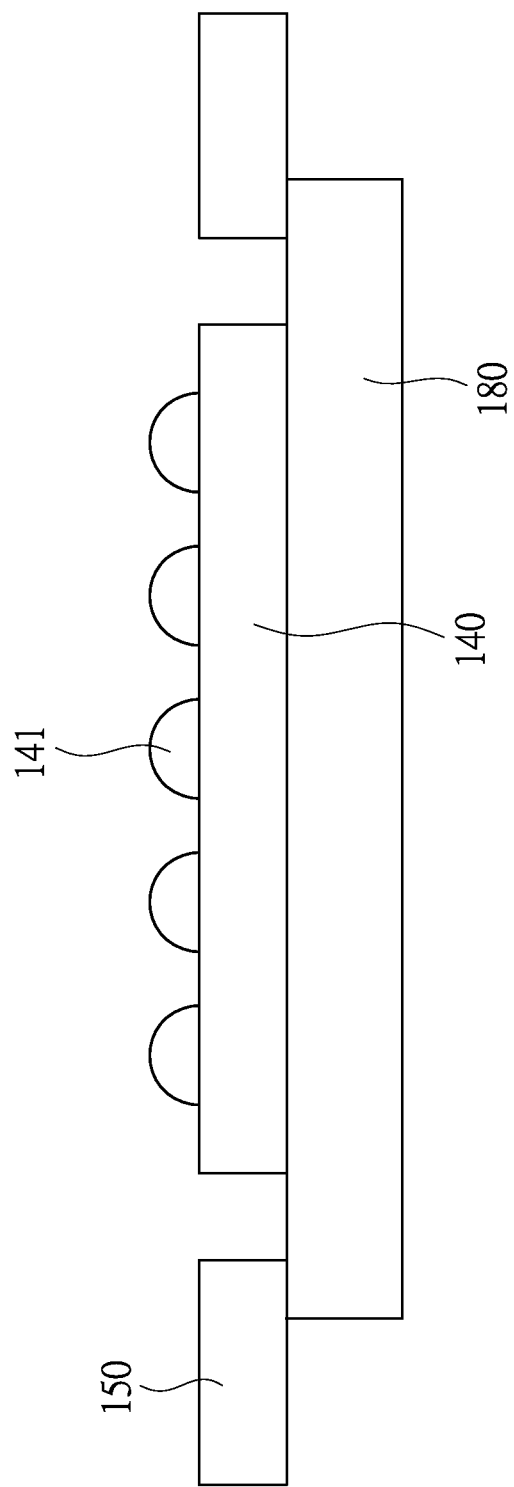
FIG. 12 is a schematic view of the ultraviolet tape shown in FIG. 11 after being removed.

FIG. 11 is a schematic view of the ultraviolet tape 152 shown in FIG. 10 when being exposed to the ultraviolet L. FIG. 12 is a schematic view of the ultraviolet tape 152 shown in FIG. 11 after being removed. As shown in FIG. 11 and FIG. 12, the ultraviolet emitting device 160 faces the light transmissive carrier 110, and the ultraviolet tape 152 is exposed to the ultraviolet L, such that the adhesion force of the ultraviolet tape 152 is eliminated. As a result, the ultraviolet tape 152 located on the first surface 144 of the wafer 140 can be removed (as shown in FIG. 12). Next, the wafer 140 may be diced to form plural image sensing chips on the supporting tape 180 by a cutter after the ultraviolet tape 152 is removed from the wafer 140. The image sensing chip may be a front-illuminated or back-illuminated CMOS image sensing chip.

Compared with the prior art, the wafer of the wafer packaging method does not need to have an optical glass sheet, but the light transmissive carrier can provide a supporting force to the wafer. When the wafer is adhered to the ultraviolet tape of the frame, the wafer does not suffer crack caused by warpage, and can be precisely adhered to the ultraviolet tape of the frame. After the wafer is bonded to the ultraviolet tape of the frame, the light transmissive carrier is adhered to the wafer by the ultraviolet temporary bonding layer, and the adhesion force of the ultraviolet temporary bonding layer may be eliminated by exposing the ultraviolet temporary bonding layer to ultraviolet. Therefore, the light transmissive carrier can be removed from the wafer. That is to say, through the application of the ultraviolet temporary bonding layer in the present invention, the process of removing the light transmissive carrier can be performed after the ball grid array process. Moreover, after the wafer having no optical glass sheet is diced, the image sensing chips formed by the wafer may be used in electronic products. Since the surface of the image sensing chip does not have the optical glass sheet, the transmittance of the image sensing chip is improved. Further, the image sensing ability of the image sensing chip is also improved.

Figure 13:
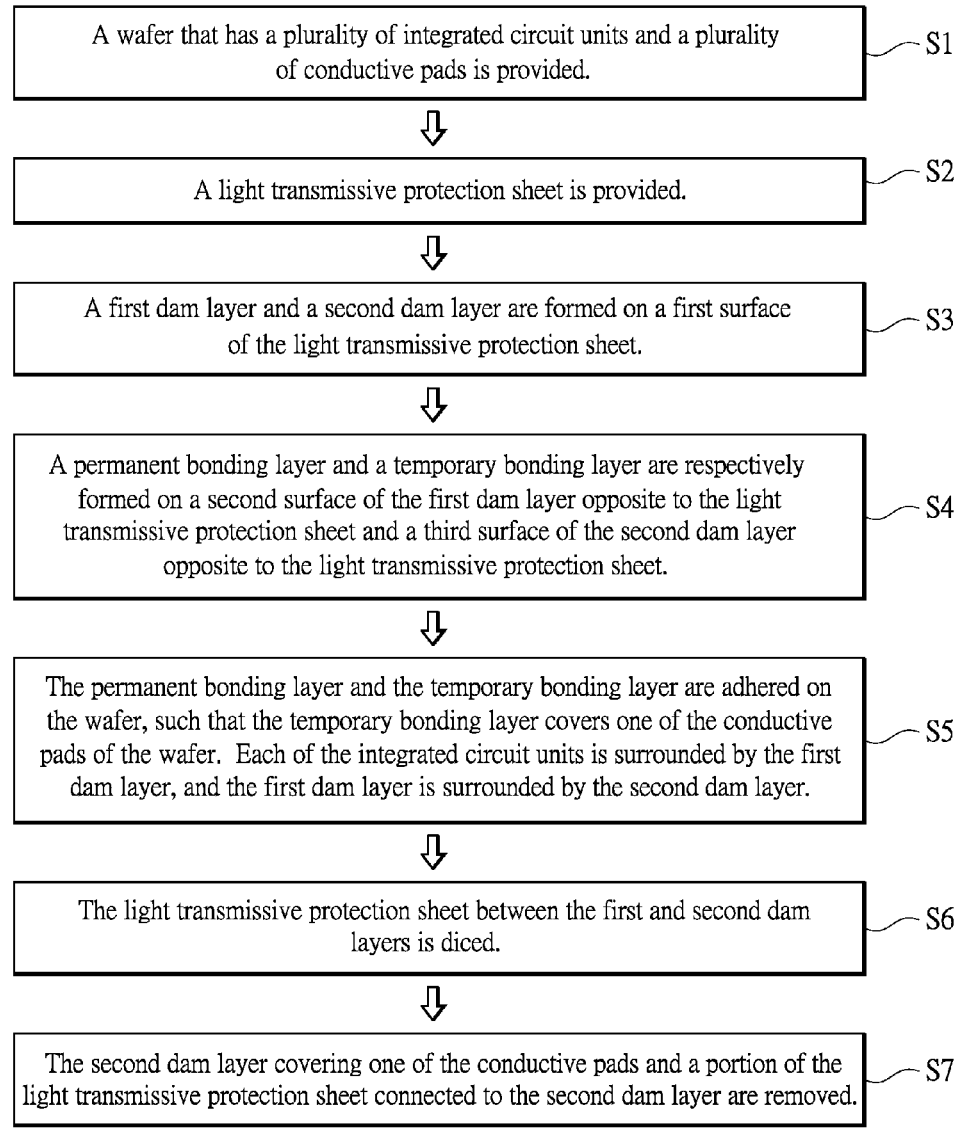
FIG. 13 is a flow chart of a wafer packaging method according to one embodiment of the present invention.

FIG. 13 is a flow chart of a wafer packaging method according to one embodiment of the present invention. In step S1, a wafer that has a plurality of integrated circuit units and a plurality of conductive pads is provided. Thereafter in step S2, a light transmissive protection sheet is provided. Next in step S3, a first dam layer and a second dam layer are formed on a first surface of the light transmissive protection sheet. Thereafter in step S4, a permanent bonding layer and a temporary bonding layer are respectively formed on a second surface of the first dam layer opposite to the light transmissive protection sheet and a third surface of the second dam layer opposite to the light transmissive protection sheet. Next in step S5, the permanent bonding layer and the temporary bonding layer are adhered on the wafer, such that the temporary bonding layer covers one of the conductive pads of the wafer. Each of the integrated circuit units is surrounded by the first dam layer, and the first dam layer is surrounded by the second dam layer. Thereafter in step S6, the light transmissive protection sheet between the first and second dam layers is diced. Finally in step S7, the second dam layer covering one of the conductive pads and a portion of the light transmissive protection sheet connected to the second dam layer are removed. In the following descriptions, the aforesaid steps will be described in detail.

Figure 14:
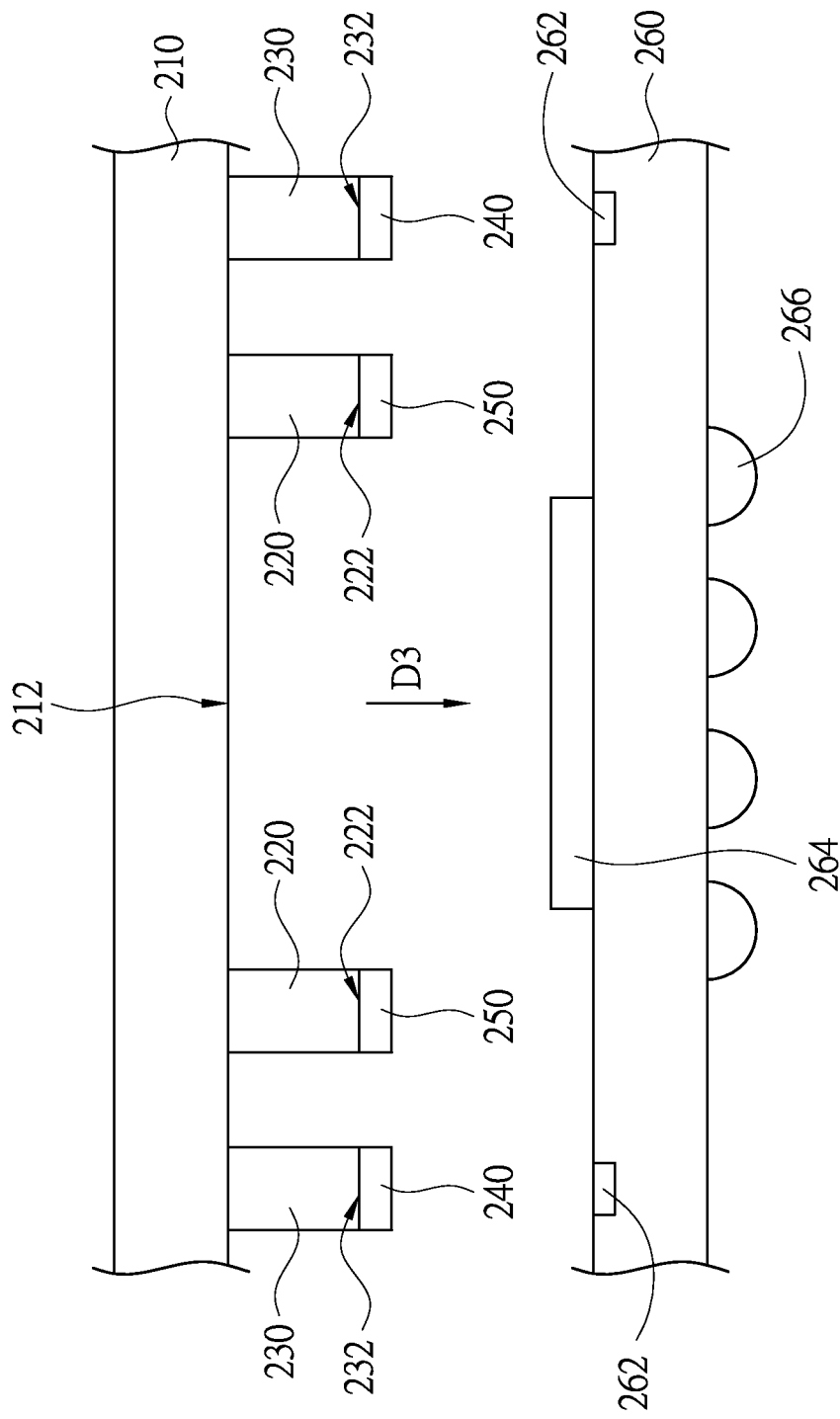
FIG. 14 is a schematic view of a light transmissive protection sheet shown in FIG. 13 when being adhered to a wafer.
Figure 15:
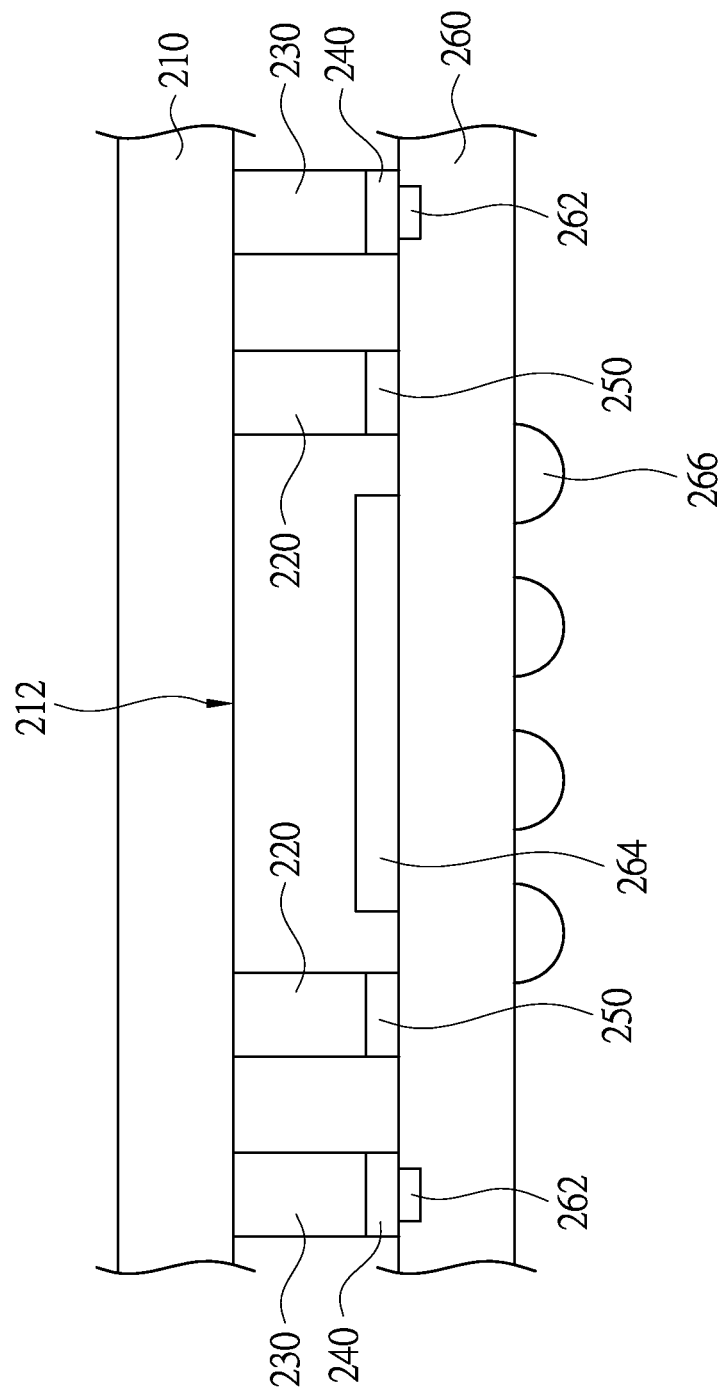
FIG. 15 is a schematic view of a permanent bonding layer and a temporary bonding layer shown in FIG. 14 after being adhered to the wafer.

FIG. 14 is a schematic view of a light transmissive protection sheet 210 shown in FIG. 13 when being adhered to a wafer 260. FIG. 15 is a schematic view of a permanent bonding layer 250 and a temporary bonding layer 240 shown in FIG. 14 after being adhered to the wafer 260. As shown in FIG. 14 and FIG. 15, the wafer 260 has a plurality of integrated circuit units 264 and a plurality of conductive pads 262. A first dam layer 220 and a second dam layer 230 are formed on the first surface 212 of the light transmissive protection sheet 210, and the second dam layer 230 is adjacent to the edge of the light transmissive protection sheet 210. Moreover, the permanent bonding layer 250 is formed on the second surface 222 of the first dam layer 220 opposite to the light transmissive protection sheet 210, and the temporary bonding layer 240 is formed and the third surface 232 of the second dam layer 230 opposite to the light transmissive protection sheet 210. When the light transmissive protection sheet 210 is moved in a direction D3, the permanent bonding layer 250 on the first dam layer 220 and the temporary bonding layer 240 on the second dam layer 230 can adhere the wafer 260. At this moment, the temporary bonding layer 240 covers the conductive pad 262 of the wafer 260, and the first dam layer 220 is located between the second dam layer 230 and the integrated circuit unit 264 of the wafer 260. That is to say, the integrated circuit unit 264 is surrounded by the first dam layer 220, and the first dam layer 220 is surrounded by the second dam layer 230.

In this embodiment, light transmissive protection sheet 210 may be a glass board, and the thickness of the light transmissive protection sheet 210 may be in a range from 300 to 500 μm. The wafer 260 may be made of a material that includes silicon. The integrated circuit unit 264 may be an image sensor. The temporary bonding layer 240 may include a material which eliminates the adhesion force when being exposed to ultraviolet, or include a material which eliminates the adhesion force when being immersed in a liquid. Designers can decide the material of the temporary bonding layer 240 as they deem necessary. The permanent bonding layer 250 may be made of material that includes epoxy.

Figure 16:
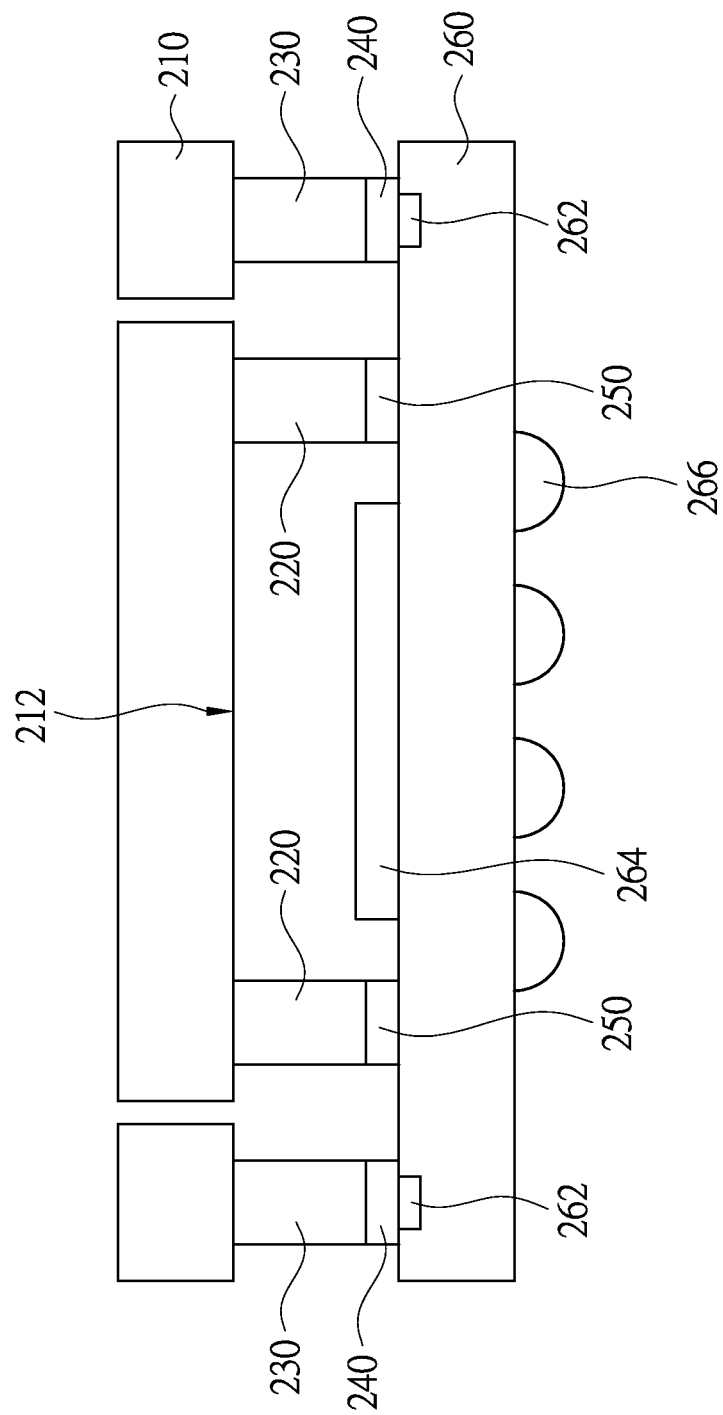
FIG. 16 is a schematic view of the light transmissive protection sheet between a first dam layer and a second dam layer shown in FIG. 15 after being diced.

FIG. 16 is a schematic view of the light transmissive protection sheet 210 between the first dam layer 220 and the second dam layer 230 shown in FIG. 15 after being diced. After the light transmissive protection sheet 210 is adhered to the wafer 260 (as shown in FIG. 15), the light transmissive protection sheet 230 between the first and second dam layers 220, 230 may be diced by a cutter, such that a gap is formed between the light transmissive protection sheets 210 on the first and second dam layers 220, 230. Furthermore, the cutter may further dice the positions of the wafer 260 and the light transmissive protection sheet 21 adjacent to the outer side of the second dam layer 230 (i.e., a side of the second dam layer 230 opposite to the first dam layer 220), as shown in FIG. 16. At this moment, the temporary bonding layer 240 may be exposed to ultraviolet to eliminate the adhesion force of the temporary bonding layer 240, or may be immersed in a liquid (e.g., 50 to 100° C. hot water), such that adhesion force of the temporary bonding layer 240 is eliminated. As a result, the second dam layer 230 covering the conductive pad 262 and a portion of the light transmissive protection sheet 210 connected to the second dam layer 230 can be removed, thereby exposing the conductive pad 262 of the wafer 260.

Figure 17:
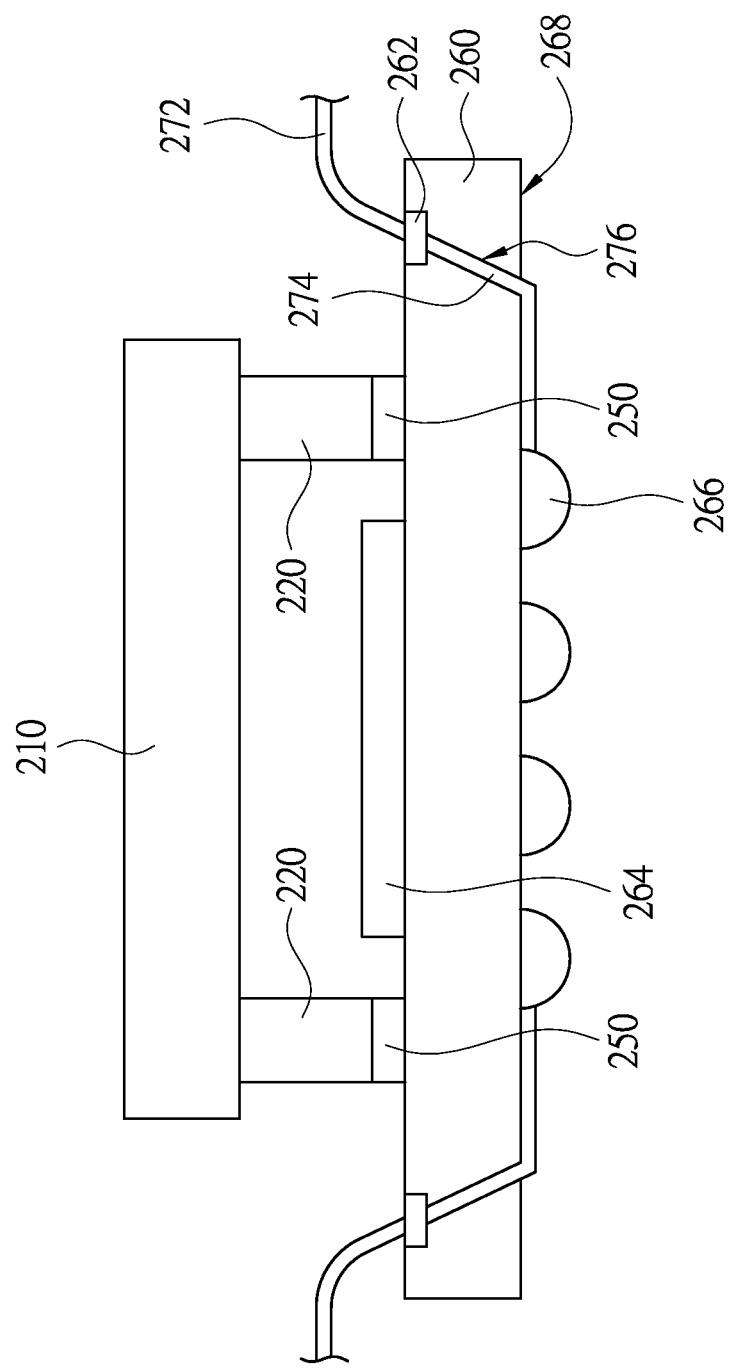
FIG. 17 is a schematic view of a portion of the light transmissive protection sheet shown in FIG. 16 after being removed and a conductive wire is electrically connected to a conductive pad shown in FIG. 16.

FIG. 17 is a schematic view of a portion of the light transmissive protection sheet 210 shown in FIG. 16 after being removed and conductive wires 272, 274 are electrically connected to the conductive pad 262 shown in FIG. 16. After the second dam layer 230 (see FIG. 16) and the light transmissive protection sheet 210 (see FIG. 16) on the second dam layer 230 are removed, the conductive wire 272 can be electrically connected to the conductive pad 262 of the wafer 260. Moreover, a through hole 276 may be formed between the conductive pad 262 and the fourth surface 268 of the wafer 260 opposite to the light transmissive protection sheet 210. Next, the conductive wire 274 may be through into the through hole 276, such that the conductive wire 274 is electrically connected to the conductive pad 262 of the wafer 260 and a ball grid array 266 located on the fourth surface 268. The structure shown in FIG. 17 may be a front-illuminated or back-illuminated CMOS image sensing chip.

In the following description, another arrangement of the conductive wire is provided to reduce the process cost of forming the through hole 276.

Figure 18:
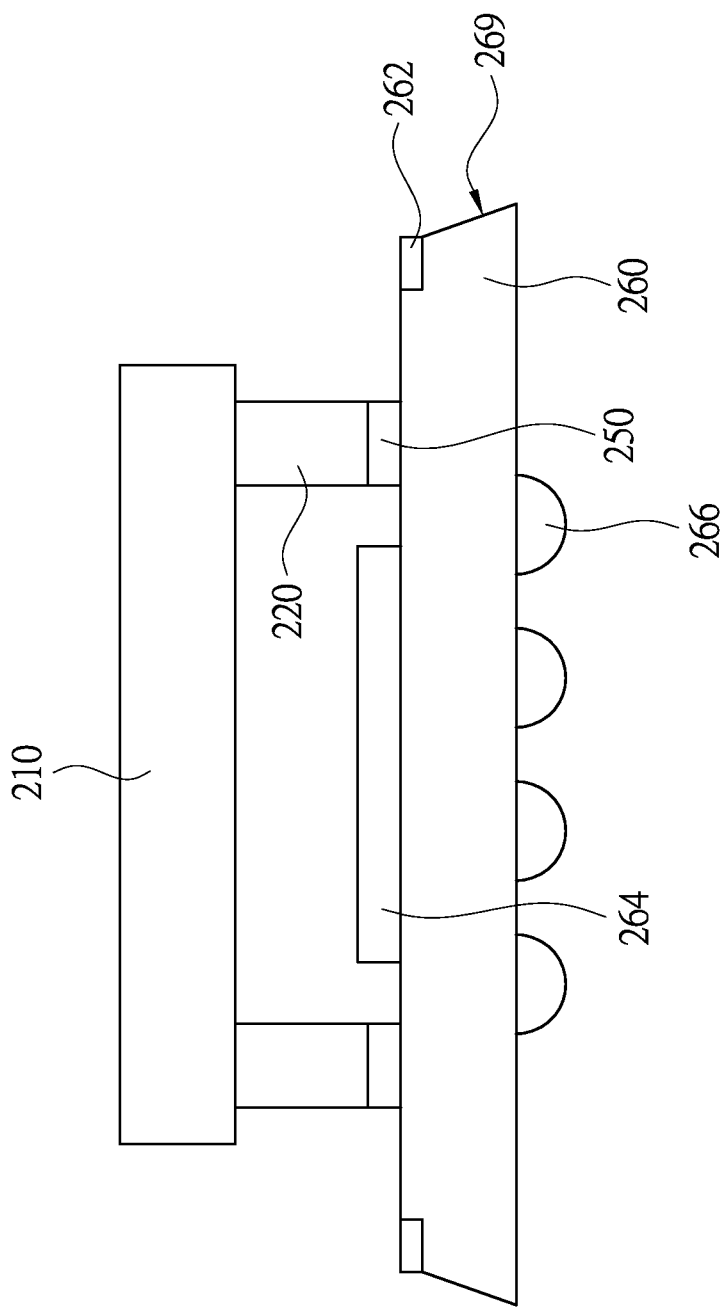
FIG. 18 is a schematic view of a portion of the light transmissive protection sheet shown in FIG. 16 after being removed and an edge of the wafer shown in FIG. 16 after being etched.

FIG. 18 is a schematic view of a portion of the light transmissive protection sheet 210 shown in FIG. 16 after being removed and the edge of the wafer 260 shown in FIG. 16 after being etched. After the second dam layer 230 (see FIG. 16) and the light transmissive protection sheet 210 (see FIG. 16) on the second dam layer 230 are removed, the edge of the wafer 260 may be etched, such that the conductive pad 262 of the wafer 260 is exposed and an inclined plane 269 is formed on the edge of the wafer 260.

Figure 19:
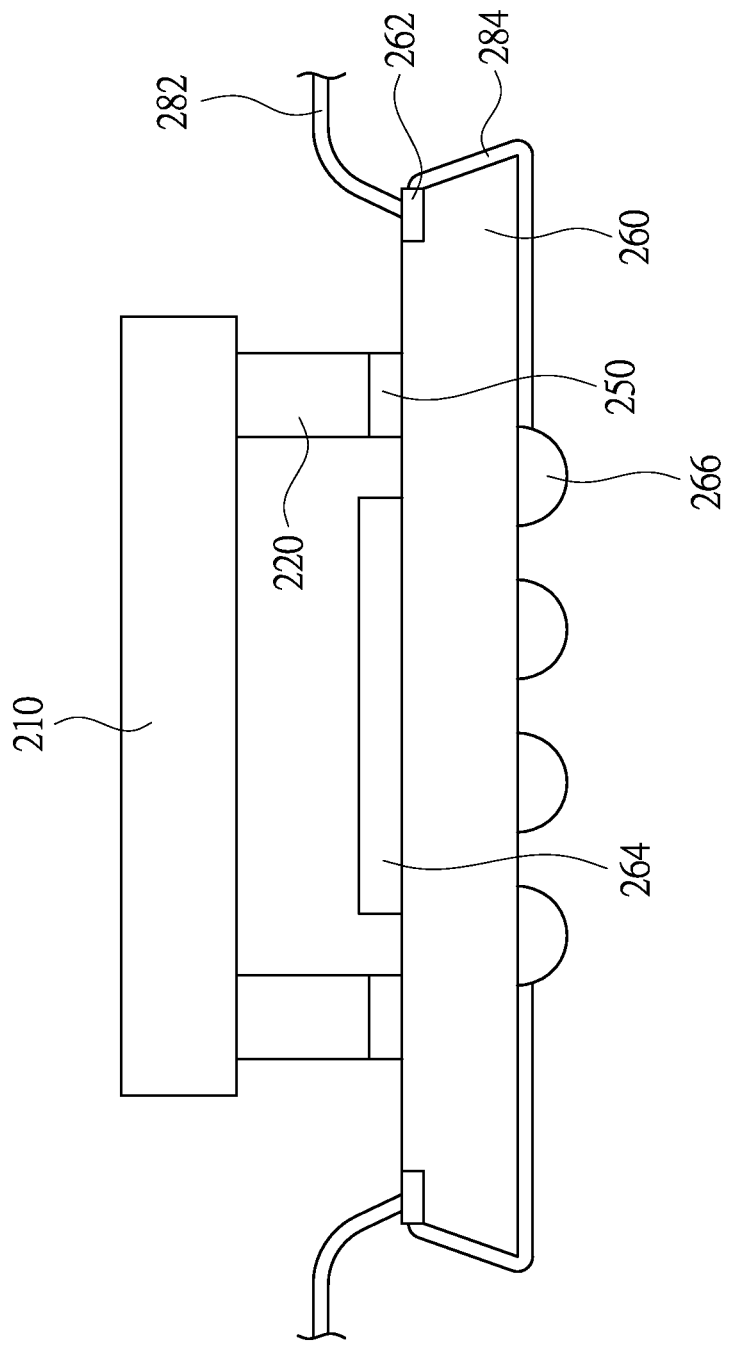
FIG. 19 is a schematic view of the conductive pad shown in FIG. 18 after being electrically connected to a conductive wire.

FIG. 19 is a schematic view of the conductive pad 262 shown in FIG. 18 after being electrically connected to conductive wires 282, 284. After the inclined plane 269 is formed, a conductive wire 282 may be electrically connected to the conductive pad 262 of the wafer 260, and a conductive wire 284 may be electrically connected to the conductive pad 262 and the ball grid array 266 of the wafer 260. The conductive wire 284 is abutted against the inclined plane 269.

Compared with the prior art, the light transmissive protection sheet of the wafer packaging method is adhered to the wafer by the permanent bonding layer located on the first dam layer and the temporary bonding layer located on the second dam layer, and the temporary bonding layer covers the conductive pad of the wafer. As a result, during a process after the light transmissive protection sheet is adhered to the wafer, such as during a dicing process or a process passing through chemical liquids, the light transmissive protection sheet and the second dam layer can prevent the conductive pad from pollution or corrosion, such that the yield rate of the wafer can be improved. Moreover, the light transmissive protection sheet between the first and second dam layers can be diced to separate. When the adhesion force of the temporary bonding layer is eliminated (e.g., exposing the temporary bonding layer to ultraviolet or immersing the temporary bonding layer in a liquid), the second dam layer covering the conductive pad and a portion of the light transmissive protection sheet connected to the second dam layer can be removed, such that the conductive pad is exposed, thereby improving the convenience of wire bonding process.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A wafer packaging method comprising:
   (a) providing a wafer having a plurality of integrated circuit units, a first surface opposite to the integrated circuit, and a second surface opposite to the first surface;
   (b) grinding the first surface of the wafer;
   (c) providing a light transmissive carrier to be adhered to the wafer, wherein the light transmissive carrier comprises a first surface and an opposing second surface;
   (d) forming a release layer on the first surface of the light transmissive carrier;
   (e) forming an ultraviolet temporary bonding layer on the first surface of the light transmissive carrier or the second surface of the wafer;
   (f) using the ultraviolet temporary bonding layer to adhere the first surface of the light transmissive carrier to the second surface of the wafer, such that the release layer is covered by the ultraviolet temporary bonding layer;
   (g) adhering the first surface of the wafer to an ultraviolet tape;
   (h) exposing the second surface of the light transmissive carrier to ultraviolet to eliminate adhesion force of the ultraviolet temporary bonding layer; and
   (i) removing the light transmissive carrier and the release layer located on the second surface of the wafer.

2. The wafer packaging method of claim 1, further comprising:
   removing a portion of the ultraviolet temporary bonding layer located on an edge of the release layer.

3. The wafer packaging method of claim 1, wherein the ultraviolet tape is located in an opening of a frame.

4. The wafer packaging method of claim 1, further comprising:
   cleaning the ultraviolet temporary bonding layer located on the second surface of the wafer.

5. The wafer packaging method of claim 1, further comprising:
   forming a notch on the ultraviolet tape adjacent to an edge of the wafer;
   adhering a supporting tape to the second surface of the wafer and the frame; and
   removing a portion of the ultraviolet tape between the notch and the frame.

6. The wafer packaging method of claim 5, further comprising:
   exposing the ultraviolet tape to ultraviolet to eliminate adhesion force of the ultraviolet tape; and
   removing the ultraviolet tape located on the first surface of the wafer.

7. The wafer packaging method of claim 6, further comprising:
   dicing the wafer after the ultraviolet tape being removed from the wafer.

8. The wafer packaging method of claim 1, wherein a thickness of the light transmissive carrier is in a range from 300 to 500 μm.

9. The wafer packaging method of claim 1, wherein a thickness of the light transmissive carrier is greater than a thickness of the wafer.

10. The wafer packaging method of claim 1, wherein a strength of the light transmissive carrier is greater than strength of the wafer.

11. A wafer packaging method comprising:
   (a) providing a wafer having a plurality of integrated circuit units and a plurality of conductive pads;
   (b) providing a light transmissive protection sheet to be adhered to the wafer, wherein the light transmissive protection sheet comprises a surface;
   (c) forming a first dam layer and a second dam layer on the surface of the light transmissive protection sheet, wherein the first dam layer comprises a surface opposite to and facing away from the light transmissive protection sheet, and the second dam layer comprises a surface opposite to and facing away from the light transmissive protection sheet;

(d) respectively forming a permanent bonding layer and a temporary bonding layer on the surface of the first dam layer and the surface of the second dam layer;

(e) adhering the permanent bonding layer and the temporary bonding layer on the wafer, such that the temporary bonding layer covers one of the conductive pads of the wafer, wherein each of the integrated circuit units is surrounded by the first dam layer, and the first dam layer is surrounded by the second dam layer;

(f) dicing the light transmissive protection sheet between the first and second dam layers; and (g) removing the second dam layer covering one of the conductive pads and a portion of the light transmissive protection sheet connected to the second dam layer.

12. The wafer packaging method of claim 11, wherein the step (g) comprises:

exposing the temporary bonding layer to ultraviolet to eliminate adhesion force of the temporary bonding layer.

13. The wafer packaging method of claim 11, wherein the step (f) comprises:

immersing the temporary bonding layer in a liquid, such that adhesion force of the temporary bonding layer is eliminated.

14. The wafer packaging method of claim 11, further comprising:

electrically connecting a conductive wire to one of the conductive pads of the wafer.

15. The wafer packaging method of claim 11, wherein the wafer comprises a surface opposite to and facing away from the light transmissive protection sheet, further comprising:

forming a through hole between one of the conductive pads and the surface of the wafer; and electrically connecting a conductive wire to one of the conductive pads and a ball grid array located on the surface of the wafer, wherein the conductive wire is through into the through hole.

16. The wafer packaging method of claim 11, further comprising:

etching an edge of the wafer, such that one of the conductive pads of the wafer is exposed and an inclined plane is formed on the edge of the wafer; and electrically connecting a conductive wire to one of the conductive pads and a ball grid array of the wafer, wherein the conductive wire is abutted against the inclined plane.

17. The wafer packaging method of claim 11, wherein each of the integrated circuit units is an image sensor.

* * * * *